(12) United States Patent
Miyatani et al.

(10) Patent No.: US 8,021,975 B2
(45) Date of Patent: Sep. 20, 2011

(54) PLASMA PROCESSING METHOD FOR FORMING A FILM AND AN ELECTRONIC COMPONENT MANUFACTURED BY THE METHOD

(75) Inventors: Kotaro Miyatani, Yamanashi (JP);
Kohei Kawamura, Hillsboro, OR (US);
Toshihisa Nozawa, Hyogo (JP);
Takaaki Matsuoka, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 174 days.

(21) Appl. No.: 12/005,683

(22) Filed: Dec. 28, 2007

(65) Prior Publication Data
US 2009/0026588 A1    Jan. 29, 2009

Related U.S. Application Data

(60) Provisional application No. 60/961,877, filed on Jul. 24, 2007.

(51) Int. Cl.
*H01L 21/4763* (2006.01)

(52) U.S. Cl. . 438/623; 438/624; 438/780; 257/E21.264; 257/E21.576

(58) Field of Classification Search ........... 257/E21.264, 257/E21.242, E21.254, E21.252, E21.576; 438/761, 763, 778, 780, 788–790, 623, 622, 438/624, 618
See application file for complete search history.

(56) References Cited

U.S. PATENT DOCUMENTS

| | | | |
|---|---|---|---|
| 5,866,920 A * | 2/1999 | Matsumoto et al. | 257/63 |
| 6,429,518 B1 * | 8/2002 | Endo | 257/753 |
| 6,443,165 B1 * | 9/2002 | Akahori et al. | 134/1.1 |
| 6,537,904 B1 * | 3/2003 | Ishizuka | 438/623 |
| 6,737,350 B1 * | 5/2004 | Akahori et al. | 438/634 |
| 6,770,332 B2 * | 8/2004 | Nakase et al. | 427/577 |
| 6,773,762 B1 * | 8/2004 | Fukiage | 427/534 |
| 6,856,019 B2 | 2/2005 | Tamaru et al. | |
| 6,949,829 B2 * | 9/2005 | Akahori et al. | 257/758 |
| 7,776,736 B2 * | 8/2010 | Kobayashi et al. | 438/622 |
| 2002/0168483 A1 * | 11/2002 | Nakase et al. | 427/569 |
| 2003/0003771 A1 * | 1/2003 | Yang et al. | 438/783 |
| 2003/0094698 A1 * | 5/2003 | Jiwari et al. | 257/758 |
| 2003/0152714 A1 * | 8/2003 | Nakase | 427/457 |
| 2003/0222296 A1 * | 12/2003 | Kumar et al. | 257/301 |
| 2004/0219736 A1 * | 11/2004 | Yoshitaka | 438/222 |

(Continued)

FOREIGN PATENT DOCUMENTS

EP    1460685 A1    9/2004

(Continued)

OTHER PUBLICATIONS

Japan Patent Office, Machine translation from Japanese to English language for Foreign Patent Document JP 2000-223485, 8 pages.

(Continued)

*Primary Examiner* — Matthew Landau
*Assistant Examiner* — Latanya Crawford (57) ABSTRACT

A plasma processing method for forming a film on a substrate using a gas processed by a plasma. The plasma processing method for forming a film includes the steps of forming a CF film on the substrate by using a $C_aF_b$ gas (here, a is a counting number, and b is a counting number which satisfies an equation of "b=2×a−2"), processing the CF film with the gas processed by the plasma, and forming an insulating film on the CF film processed by using an insulating material processed with the plasma.

19 Claims, 11 Drawing Sheets

U.S. PATENT DOCUMENTS

| | | | |
|---|---|---|---|
| 2004/0266140 A1* | 12/2004 | Conti et al. | 438/475 |
| 2005/0064692 A1* | 3/2005 | Swanson et al. | 438/596 |
| 2007/0228527 A1* | 10/2007 | Kobayashi | 257/635 |
| 2007/0287292 A1* | 12/2007 | Li et al. | 438/694 |
| 2008/0254641 A1 | 10/2008 | Kobayashi et al. | |

FOREIGN PATENT DOCUMENTS

| | | |
|---|---|---|
| EP | 1786029 A1 | 5/2007 |
| JP | 2000-223485 A | 8/2000 |
| JP | 2005-093737 | 4/2005 |
| JP | 2005-150612 | 6/2005 |
| JP | 2006-324023 | 11/2006 |
| KR | 10-2006-0127109 | 12/2006 |
| WO | WO 00/74127 A1 | 12/2000 |

OTHER PUBLICATIONS

Korean Intellectual Property Office, International Search Report and Written Opinion for corresponding International application No. PCT/US2008/009021, date of mailing Jan. 9, 2009, 5 pages.

* cited by examiner

FIG. 1

Structural formula of the surface of CFx

FIG. 2

Structure of the surface of CFx
when processing with a CO gas

FIG. 3

Structural formula of the surface of CFx after processing with a CO gas

FIG. 11

PLASMA PROCESSING METHOD FOR FORMING A FILM AND AN ELECTRONIC COMPONENT MANUFACTURED BY THE METHOD

This application claims priority to U.S. Provisional Application Ser. No. 60/961,877, filed on Jul. 24, 2007, entitled "Manufacturing Method for Semiconductor Device", which is incorporated herein by reference in its entirety.

TECHNICAL FIELD

The present invention relates to a method for forming a film on a substrate using plasma in an electronic component applicable to a semiconductor device, a liquid crystal display device and an organic EL element, and also relates to the electronic component manufactured by the method.

BACKGROUND OF THE INVENTION

In a manufacturing process for electronic devices, such as semiconductor devices, liquid crystal display devices, and organic electro-luminescent (EL) elements, a film forming process is performed to form a conductive film (CF) or an insulating film on the surface of a substrate. A plasma film forming process for forming a film on a substrate using plasma is employed in this film forming process. In a case when forming a CF film on a substrate, and further forming an insulating film on the CF film in the film forming process, there has been a problem that the fluorine atom in the CF film diffuses in the insulating film, thereby the contactablity of the CF film and the insulating film decreases. Also, there has been a problem that the insulation film may peel off due to corrosion of the insulating film by the fluorine atom diffused in the insulating film when the CF film and the insulating film are heat treated at a subsequent film forming process.

By the way, the above plasma film forming process is normally performed by a plasma film forming device. In recent years, a microwave plasma film forming device, which forms a film by generating plasma by a microwave field, has been attracting attention as a type of plasma film forming device. According to this microwave plasma film forming device, high-density plasma compared to the conventional film forming devices can be obtained, thereby the film forming process to the substrate can be performed effectively in a short time.

The microwave plasma film forming device described above is provided with, for example, a placing base to place a substrate inside a treatment vessel. And on the upper portion of the treatment vessel, provided are radial line slot antennas, and a shower ring to pass through the microwave from the radial line antennas and to supply plasma gas. Further, the microwave plasma film forming device is configured to a supply material gas for film from the wall surface of the treatment vessel.

As a plasma processing method for forming a film using the microwave plasma film forming device, for example, the following has been known. For example, Japanese Published Unexamined Patent Application No. 2005-093737 discloses a plasma processing method for forming a film on a substrate which is capable of forming a high quality film with a low temperature in a short time by optimizing the amounts of radicals and ions supplied to the substrate. Also, Japanese Published Unexamined Application No. 2006-324023 discloses a plasma film forming device capable of minimizing deformation or distortion of the shower ring by maintaining the temperature of the shower ring to a desired temperature, and improving the uniformity of an in-plane temperature of the shower ring.

Also, Japanese Published Unexamined Patent Application No. 2005-150612 discloses a plasma film forming device which prevents the gas for plasma excitation from plasmanizing before it is supplied to the treatment vessel, and appropriately generates plasma within the area of a high-frequency wave supplying side, that is, a plasma generating area.

Further, International Published Unexamined Patent Application No. 2000-74127 discloses a plasma process device capable of maintaining the stability of the plasma regardless of the type of gas used for the process because there is no film attachment on the surface of the dielectric shower ring of the microwave introduction part due to dissociation or binding of the gas for processing.

However, it is difficult to prevent the fluorine atom in the CF film formed on the substrate from diffusing in the insulating film, and also to prevent the contactablity of the CF film and the insulating film from deteriorating by using any of the methods described in the documents above.

SUMMARY OF THE INVENTION

In accordance with one aspect of the present invention, a plasma processing method for forming a film on a substrate includes the steps of:

forming a CF film on the substrate by using a $C_aF_b$ gas (here, a is a counting number, and b is a counting number satisfying an equation of "$b=2 \times a-2$"), processing the CF film with a gas processed by a plasma, and forming an insulating film on the processed CF film by using an insulating material processed with a plasma.

In a case when processing the CF film with a plasma gas before forming the insulating film on the CF film, the diffusion of the fluorine in the insulating film may be decreased because the fluorine existing on the surface of the CF film can be reduced and removed. Further, by processing the CF film with the plasma gas, the corrosion of the insulating film can be prevented when heat treating the insulating film. In this way, the contactability of the CF film and the insulating film can be improved.

The insulating film may be $Si_xC_yN_z$ film (here, x, y and z are counting numbers). Further, the insulating material may be methylsilazane.

The insulating film may be $Si_xC_y$ film (here, x and y are counting numbers). Further, the insulating material may be mono-methylsilane, di-methylsilane, or tri-methylsilane.

A plurality of insulating films may be formed on the CF film processed as described above at the process for forming the insulating film.

Further, the process for forming the insulating film may include a process for forming a $Si_xC_yN_z$ film (here, x, y and z are counting numbers, and y and z satisfy y<z) on the CF film processed as described above. In a case when forming the SiCN film, which has a higher nitrogen content than a methyl content, on the CF film, the diffusion of the fluorine atom from the CF film to the SiCN film may be decreased because the barrier characteristic of the SiCN film against the fluorine increases. As a result, the contactability of the CF film and the SiCN film can be improved.

The process for forming the insulating film described above may include a process for further forming a $Si_{x'}C_{y'}N_{z'}$ film (here, x', y' and z' are counting numbers, and x' and z' satisfy y<z) on the $Si_xC_yN_z$ film.

In a case when forming the SiCN film, which has a higher methyl content than a nitrogen content, the hydrogen plasma damage to the CF film and the SiCN film may be decreased due to the low hydrogen content of the SiCN film. In this way, the contactability of the CF film and the SiCN film can be improved.

The CF gas may be $C_4F_6$ gas, $C_5F_8$ gas or $C_3F_4$ gas. Further, the gas for processing the CF film may be CO gas.

In accordance with one aspect of the present invention, an electronic component forming a film on a substrate using a gas processed with a plasma, and the electronic component is manufactured by a method includes the steps of:

forming a CF film on the substrate by using a $C_aF_b$ gas (here, a is a counting number, and b is a counting number satisfying an equation of "b=2×a−2"), processing the CF film with a gas processed by a plasma, and forming an insulating film on the CF film processed by using an insulating material processed with a plasma.

In a case when processing the CF film with a plasma gas before forming the insulating film on the CF film, the diffusion of the fluorine in the insulating film may be decreased because the fluorine existing on the surface of the CF film can be reduced and removed. Further, by processing the CF film with a plasma gas, the corrosion of the insulating film can be prevented when heat treating the insulating film. In this way, the contactability of the CF film and the insulating film can be improved.

The insulating film may be $Si_xC_yN_z$ film (here, x, y and z are counting numbers). And the insulating film may be $Si_xC_y$ film (here, x and y are counting numbers). Further, the insulating material may be mono-methylsilane, di-methylsilane, or tri-methylsilane.

A plurality of insulating films may be formed on the CF film processed as described above at a process for forming the insulating film.

Further, the process for forming the insulating film may include a process for forming a $Si_xC_yN_z$ film (here, x, y and z are counting numbers, and y and z satisfy y<z) on the CF film processed as described above.

In a case when forming the SiCN film, which has a higher nitrogen content than a methyl content, on the CF film, the diffusion of the fluorine atom from the CF film to the SiCN film may be decreased because the barrier characteristic of the SiCN film against the fluorine increases. As a result, the contactability of the CF film and the SiCN film can be improved.

The process for forming the insulating film described above may include a process for further forming a $Si_{x'}C_{y'}N_{z'}$ (here, x', y' and z' are counting numbers, and x' and z' satisfy y<z) on the $Si_xC_yN_z$ film.

In a case when forming the SiCN film with a higher methyl content than a nitrogen content, the hydrogen plasma damage to the CF film and the SiCN film may be decreased due to the low hydrogen content of the SiCN film. In this way, the contactability of the CF film and the SiCN film can be improved.

The CF gas may be $C_4F_6$ gas, $C_5F_8$ gas or $C_3F_4$ gas. Further, the gas for processing the CF film may be CO gas.

In accordance with one aspect of the present invention, a method for forming a film on a substrate includes the steps of:

forming a CF film on the substrate by using a $C_aF_b$ gas (here, a is a counting number and b is a counting number satisfying an equation of "b=2×a−2"), processing the CF film with a reduced gas, and forming an insulating film on the processed CF film by using an insulating material. Further, the insulating film may be a $Si_xC_yN_z$ film (here, x, y and z are counting numbers).

In a case when processing the CF film with a plasma gas before forming the insulating film on the CF film, the diffusion of the fluorine into the insulating film may be decreased because the fluorine existing on the surface of the CF film can be reduced and removed. Further, by processing the CF film with a plasma gas, the corrosion of the insulating film can be prevented when heat treating the insulating film. In this way, the contactability of the CF film and the insulating film can be improved.

The process for forming the insulating film may include a process for forming a $Si_xC_yN_z$ film (here, x, y and z are counting numbers, and y and z satisfy y>z) on the CF film processed as described above.

In a case when forming the SiCN film, which has a higher nitrogen content than the methyl content on the CF film, the diffusion of a fluorine atom from the CF film to the SiCN film may be decreased because the barrier characteristics of the SiCN film against the fluorine increases. As a result, the contactability of the CF film and SiCN film can be improved.

The process for forming the insulating film described above may include a process for further forming a $Si_{x'}C_{y'}N_{z'}$ film (here, x', y' and z' are counting numbers, and y' and z' satisfy y'>z') on the $Si_xC_yN_z$ film.

In a case when forming the SiCN film, which has a higher methyl content than a nitrogen content, the hydrogen plasma damage to the CF film and the SiCN film may be decreased due to the low hydrogen content of the SiCN film. In this way, the contactability of the CF film and the SiCN film can be improved. Further, the gas to process the CF film may be CO gas.

DETAILED DESCRIPTION OF INVENTION

One aspect of the present invention is a plasma processing method for forming a film on a substrate with a gas processed with plasma, the plasma processing method for forming a film including the steps of forming a CF film on the substrate by using a $C_aF_b$ gas (here, a is a counting number, and b is a counting number which satisfying an equation of "b=2×a−2"), processing the CF film with the gas processed by a plasma, and forming an insulating film on the CF film proceed by using an insulating material processed with a plasma.

Figure 1:
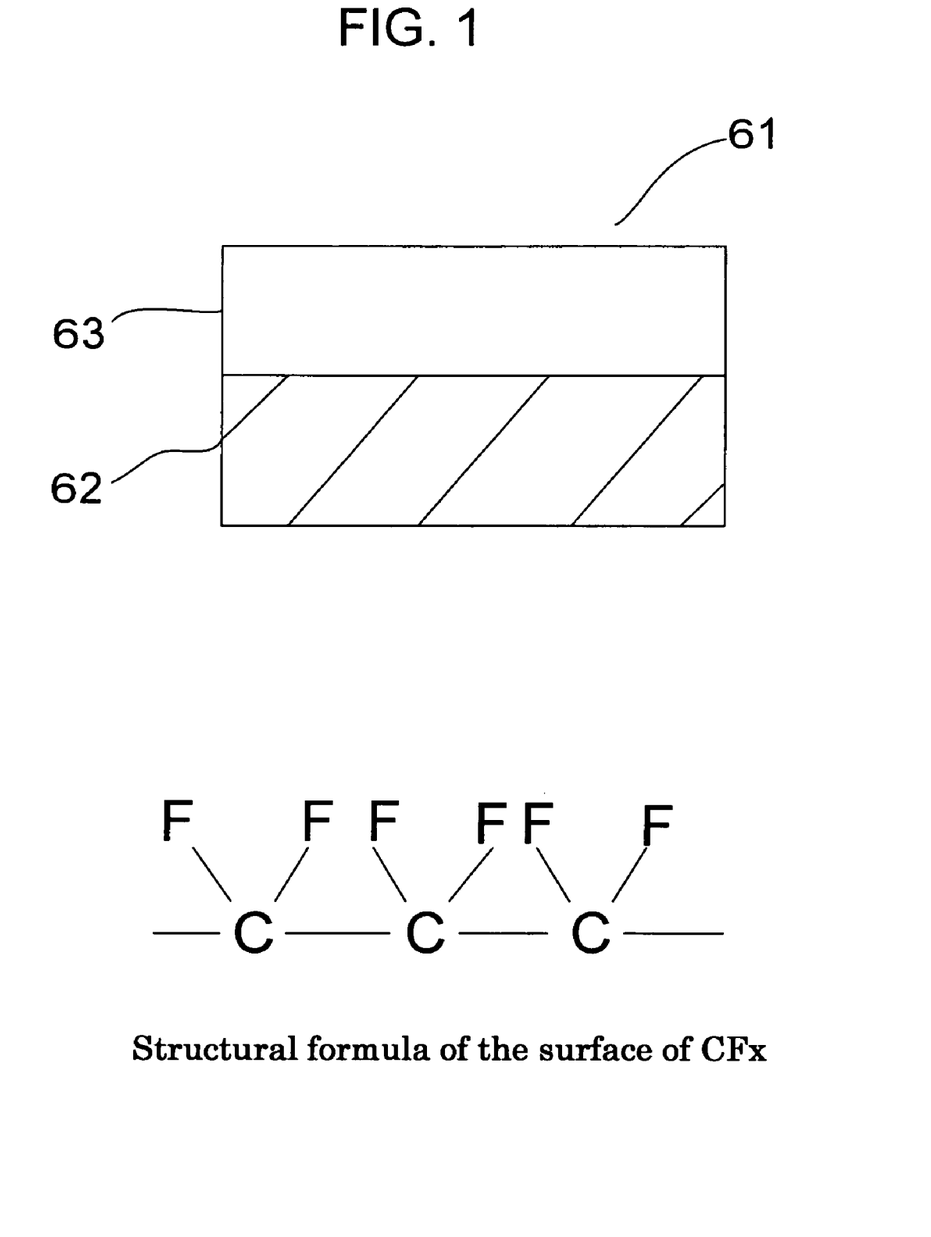
FIG. 1 illustrates an electronic component forming a CF film on a substrate.

First, a CF film is formed on a substrate in the plasma processing method for forming a film. FIG. 1 illustrates an electronic component 61 forming a CF film 63 on a substrate 62. The surface of the CF film on the substrate has a structure, for example, shown on the lower portion of FIG. 1. With respect to the $C_aF_b$ gas according to the present invention, a is a counting number, and b is a counting number which satisfying an equation of "b=2×a−2". Particularly, $C_4F_6$ gas, $C_5F_8$ gas, $C_3F_4$ gas, $C_6F_{10}$ gas, $C_7F_{12}$ gas, or $C_2F_2$ gas may be utilized as a $C_aF_b$ gas. Further, a plurality of CF films may be formed on the substrate according to the present invention.

Figure 2:
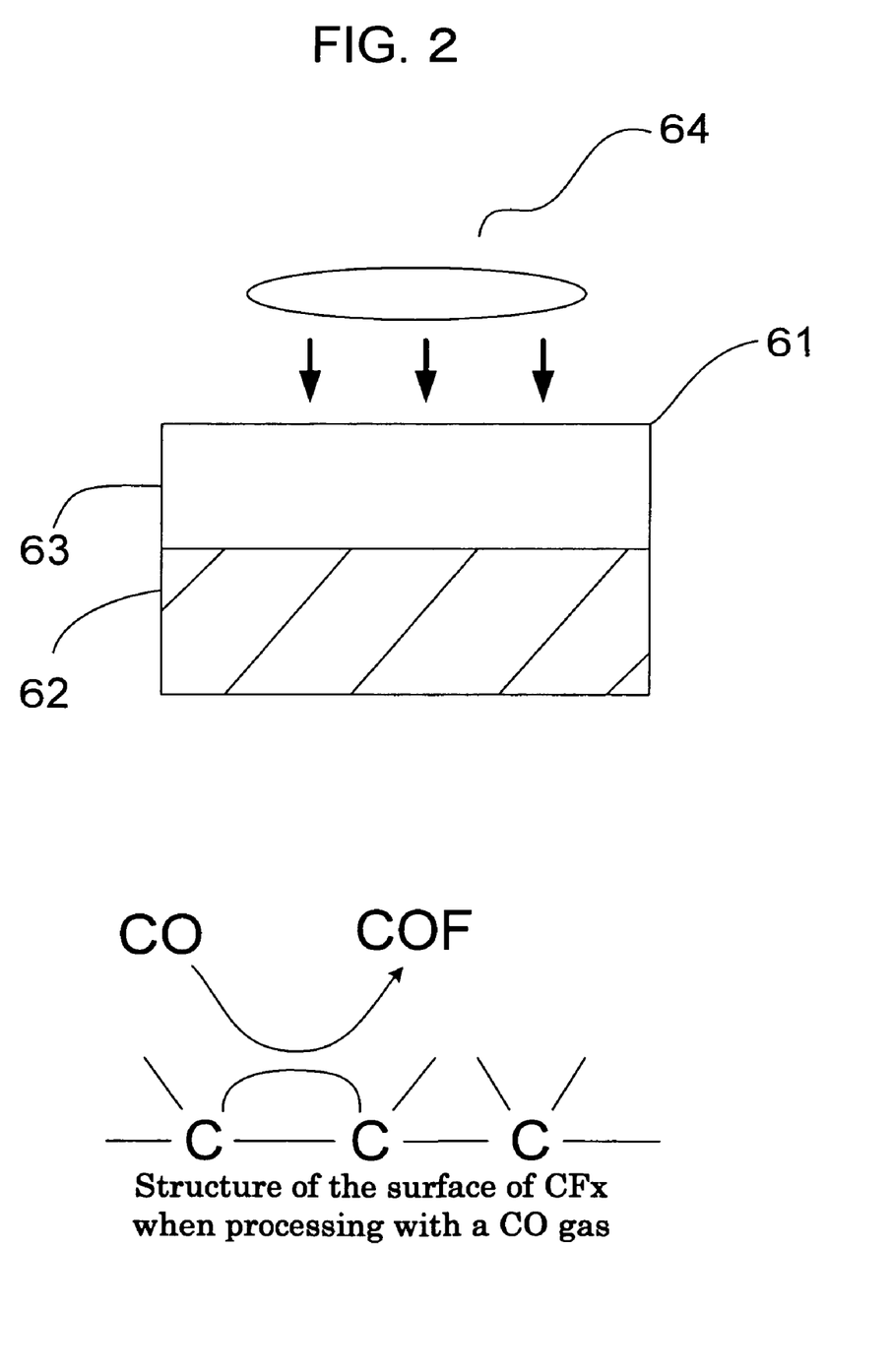
FIG. 2 illustrates a condition of processing the surface of a CF film formed on a substrate with a gas processed with a plasma.

After forming the CF film on the substrate, process the formed CF film with a gas processed by a plasma. FIG. 2 illustrates a condition of processing the surface of the CF film 63 formed on the substrate 62 with a gas 64 processed with a plasma. With respect to the gas processed by a plasma (hereinafter also referred as a plasma gas), a CO based gas may be utilized. For example, CO gas (carbon monoxide gas), HCO gas, and $CH_3CO$ gas may be utilized as a CO based gas. In a case when processing the surface of the CF film 63 with the CO gas, the CO gas and a fluorine atom, which exists in the surface of the CF film 63, react and generate COF gas as shown in the lower portion of FIG. 2. That is, the fluorine end group on the surface of the CF film is removed.

Figure 3:
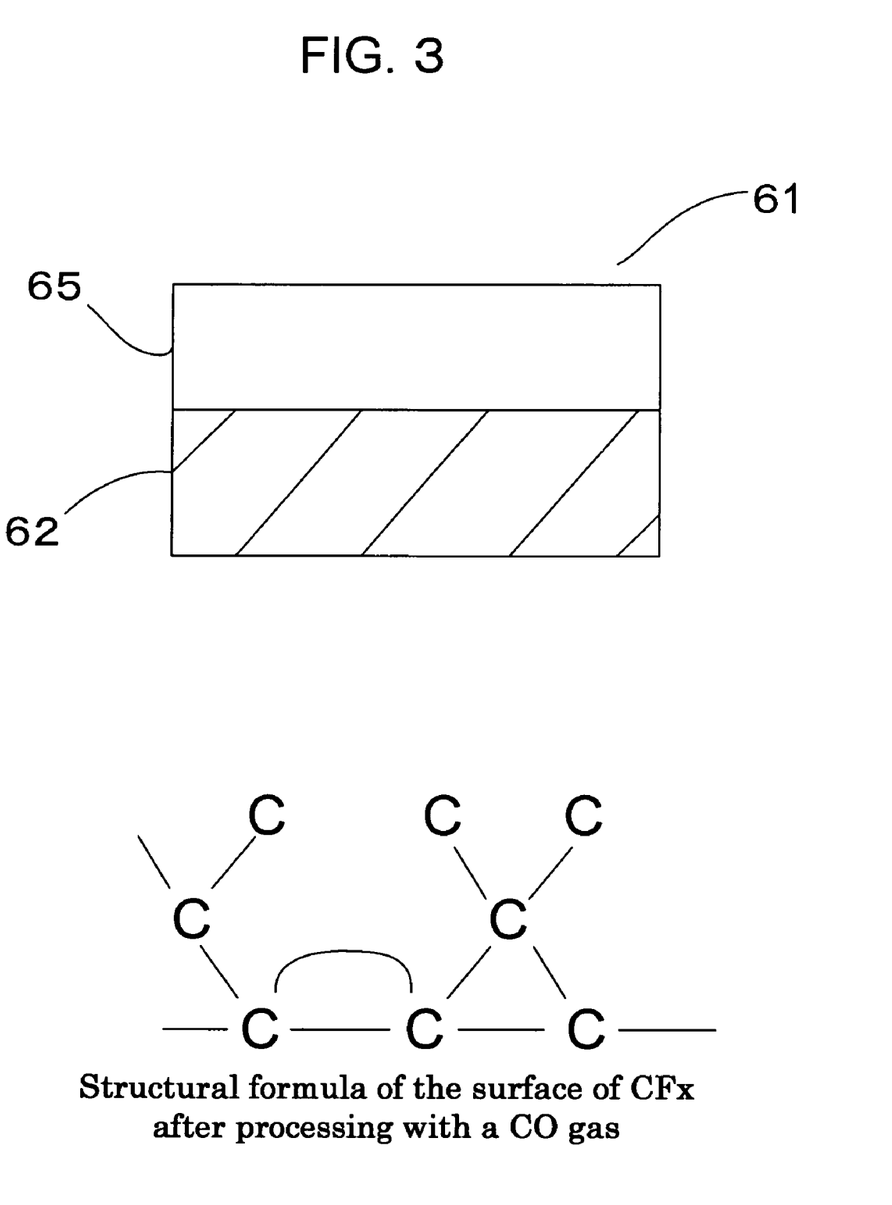
FIG. 3 illustrates an electronic component after removing a fluorine end group on the surface of the CF film

FIG. 3 illustrates an electronic component 61 after removing the fluorine end group on the surface of the CF film 65. The CF film reacts with a CO derived carbon atom, terminating the carbon atom bond with a carbon atom after removing the fluorine, and forming a cross-linked structure of carbon-carbon coupling. The result is a CF film processed with the CO gas, for example, a chemical structure shown in the lower portion of FIG. 3.

Figure 4:
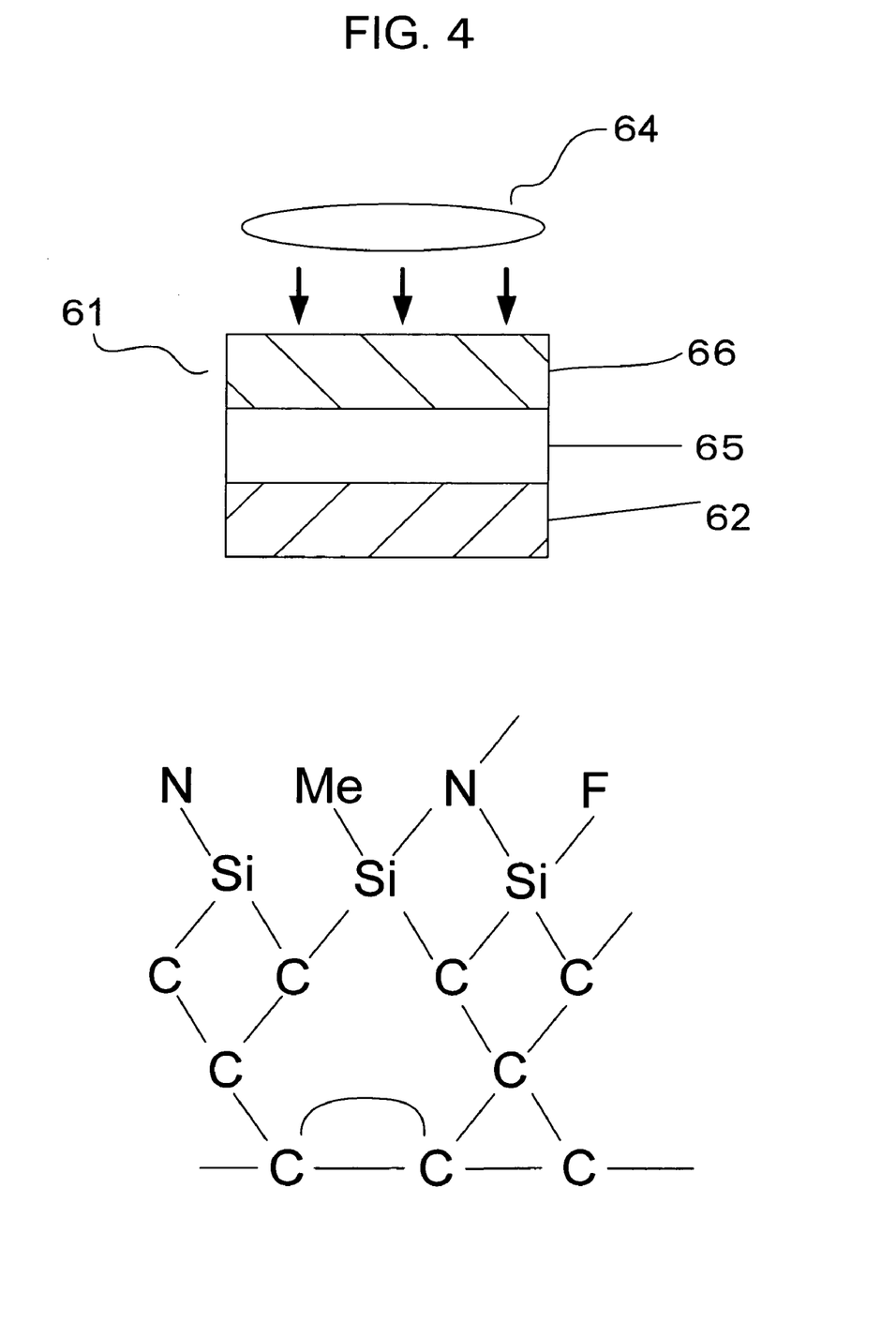
FIG. 4 illustrates an electronic component forming an insulating film on a CF film using an insulating material processed with a plasma.

Next, form an insulating film on the CF film processed with plasma gas. The insulating film is formed on the CF film by using an insulating material processed with plasma. FIG. 4 illustrates an electronic component 61, in which an insulating film 66 formed on a CF film 65 by using an insulating material processed with plasma. Here, for example, $SiO_2$ film, SiC film, SiON film, SiCN film, SiCO film, SiC film, SiCN film, SiCHO film may be utilized as an insulating film. A plurality of insulating films may be formed on the CF film 65. In a case when forming the plurality of insulating films on the CF film 65, the types of insulating films may be the same or may be different.

Further, for example, methane and, silane, mono-methylsilane (1MS), di-methylsilane (2MS), tri-methylsilane (3MS), tetra-methylsilane (4MS), and silazane may be utilized as an insulating material. As a silazane, for example, methylsilazane, and ethylsilazane may be utilized. These insulating materials may be mixed to form the insulating film. A material gas may be utilized to form the insulating film as needed. For example, nitrogen ($N_2$) and ammonia ($NH_3$) may be utilized as a material gas. Further, these gases may be mixed to form the insulating film. In a case when methylsilazane is used as an insulating material to form a SiCN film as an insulating film, the SiCN film may be formed without using the material gas. In a case when nitrogen ($N_2$) or ammonia ($NH_3$) is used when using methylsilazane, the amount of nitrogen in the SiCN film to be formed may be increased. In this way, the material gas may be used to adjust the concentration of nitrogen in the SiCN film.

In a case when processing the CF film with plasma gas before forming the insulating film on the CF film, diffusion of fluorine in the insulating film may be decreased because the fluorine existing on the surface of the CF film can be reduced and removed. Also, processing the CF film with a plasma gas prevents the insulating film from corrosion when the insulating film is heat processed. In this way, the contactability of the CF film and the insulating film can be increased. In a case when the insulating film is formed on the CF film after processing with a plasma gas, a cross-linked structure of the carbon-carbon coupling as shown in the lower portion of FIG. 3 is formed on the substrate 62, and the electronic component 61 will have a chemical structure that the insulating film binds to the carbon-carbon coupling. At this time, the chemical structure between the CF film and the insulating film may be, for example, as shown in the lower portion of FIG. 4.

Figure 5:
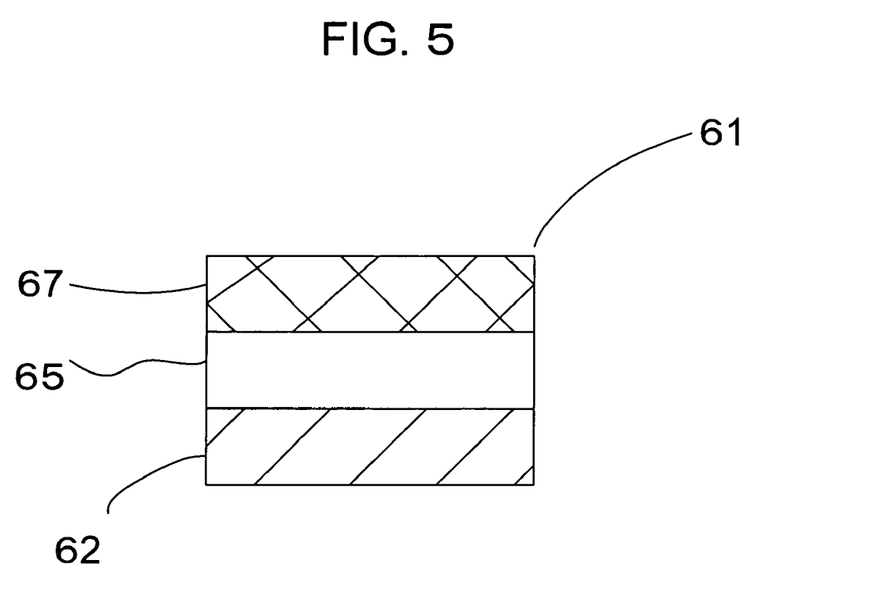
FIG. 5 illustrates an electronic component forming a SiCN film on the surface of a CF film using mono-methylsilane (1MS) and nitrogen ($N_2$), or ammonia ($NH_3$).

Next, a process to form an insulating film on a CF film is explained by referring to a specific example. FIG. 5 illustrates an electronic component 61 forming a SiCN film 67 on the surface of a CF film 65 using mono-methylsilane (1MS) processed with plasma, and nitrogen ($N_2$) or ammonia ($NH_3$) processed with plasma. In this embodiment, mono-methylsilane (1MS) is used as an insulating material, thus the nitrogen content in the forming SiCN film 67 is larger than the methyl content. Namely, when indicating the SiCN film 67 formed in the process in a form of $Si_xC_yN_z$, it is $Si_xC_yN_z$ film (here, x, y and z are counting numbers, and y and z satisfy y<z). At this time, the chemical structure between the CF film and the SiCN film is, for example, as shown in the lower portion of FIG. 5. As it can be appreciated from the chemical structure shown in the lower portion of FIG. 5, the SiCN film 67 is in a condition where the amount of nitrogen atoms is larger than the methyl group.

In a case when forming the SiCN film which has a higher nitrogen content than a methyl content, on the CF film, the diffusion of fluorine atom from the CF film to SiCN film may be decreased because the barrier characteristics of the SiCN film against the fluorine increases. As a result, contactability of the CF film and SiCN film can be increased.

Figure 6:
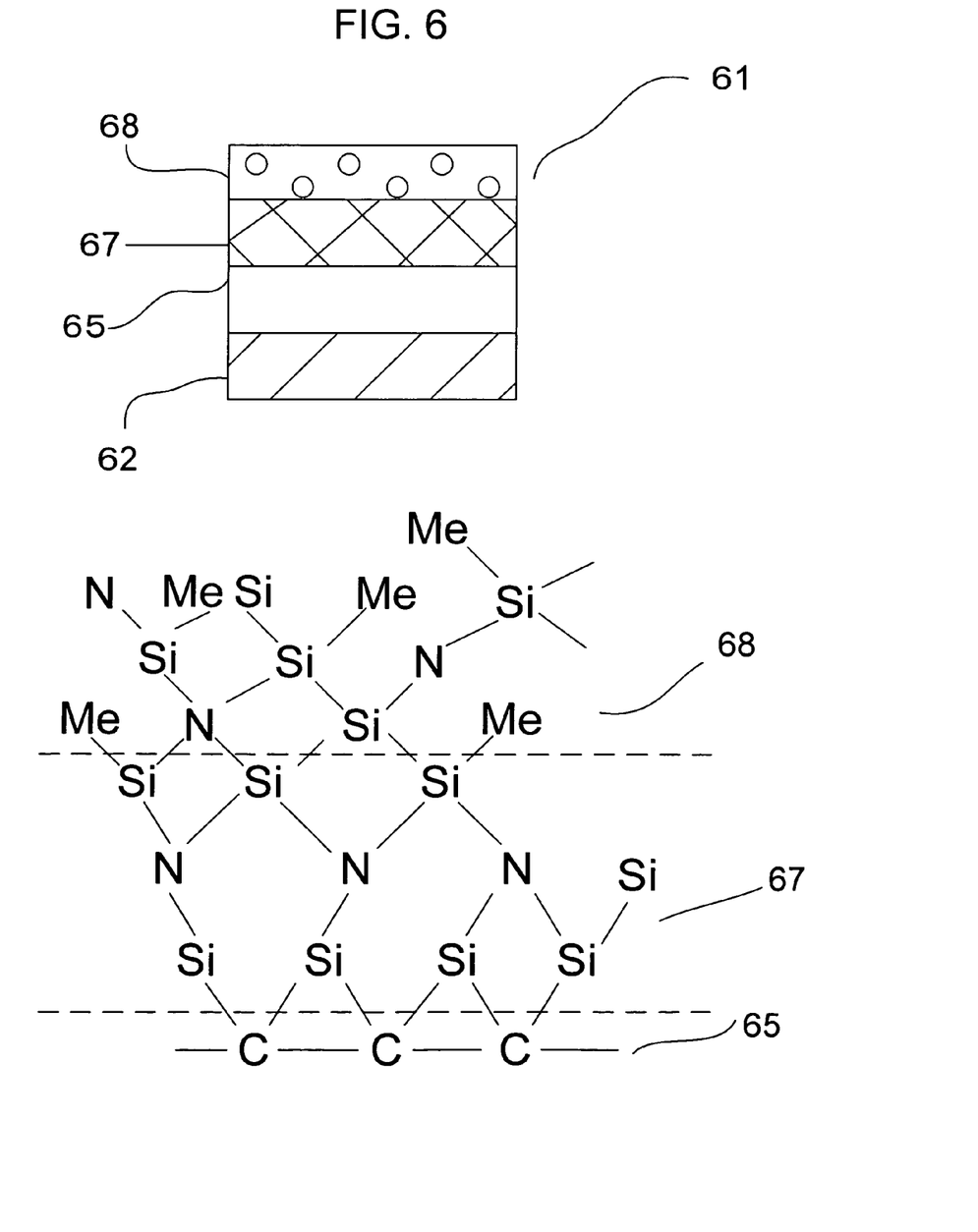
FIG. 6 illustrates an electronic component further forming a SiCN film on the SiCN film formed in FIG. 5.

FIG. 6 illustrates an electronic component 61 further forming a SiCN film 68 on the SiCN film 67 formed in FIG. 5. The SiCN film 68 is formed by using tri-methylsilane (3MS) processed with plasma, and nitrogen ($N_2$), or ammonia ($NH_3$) processed with plasma. Since the SiCN film 68 is formed by using tri-methylsilane (3MS), the methyl content is larger than the nitrogen content. Namely, when indicating the SiCN film 68 formed in the process in a form of $Si_{x'}, C_{y'}, N_{z'}$, it is a $Si_{x'}C_{y'}N_{z'}$ film (here, x', y' and z' are counting numbers, and y' and z' satisfy y'>z'). At this time, the chemical structures between each film, the CF film 65, SiCN film 67 and SiCN film 68, are, for example, as shown in the lower portion of FIG. 6. As it can be appreciated from the chemical structure shown in the lower portion of FIG. 6, the SiCN film 68 is in a condition where the amount of nitrogen atoms is larger than the methyl group.

Because the SiCN film 68 formed in the process illustrated in FIG. 6 utilizes tri-methylsilane as a material, which has a low hydrogen content, the hydrogen plasma damage to the CF film and the SiCN film 67 can be decreased. This also improves contactability of the CF film 65, and the SiCN films 67 and 68.

Next, a method for forming a film by generating a plasma and a plasma processing method for forming a film according to the present invention is discussed. In this aspect of the present invention, the method for forming a film by generating a plasma is not limited specifically, and any method may be used. A method for forming a film using a plasma film forming device is hereinafter explained.

Figure 7:
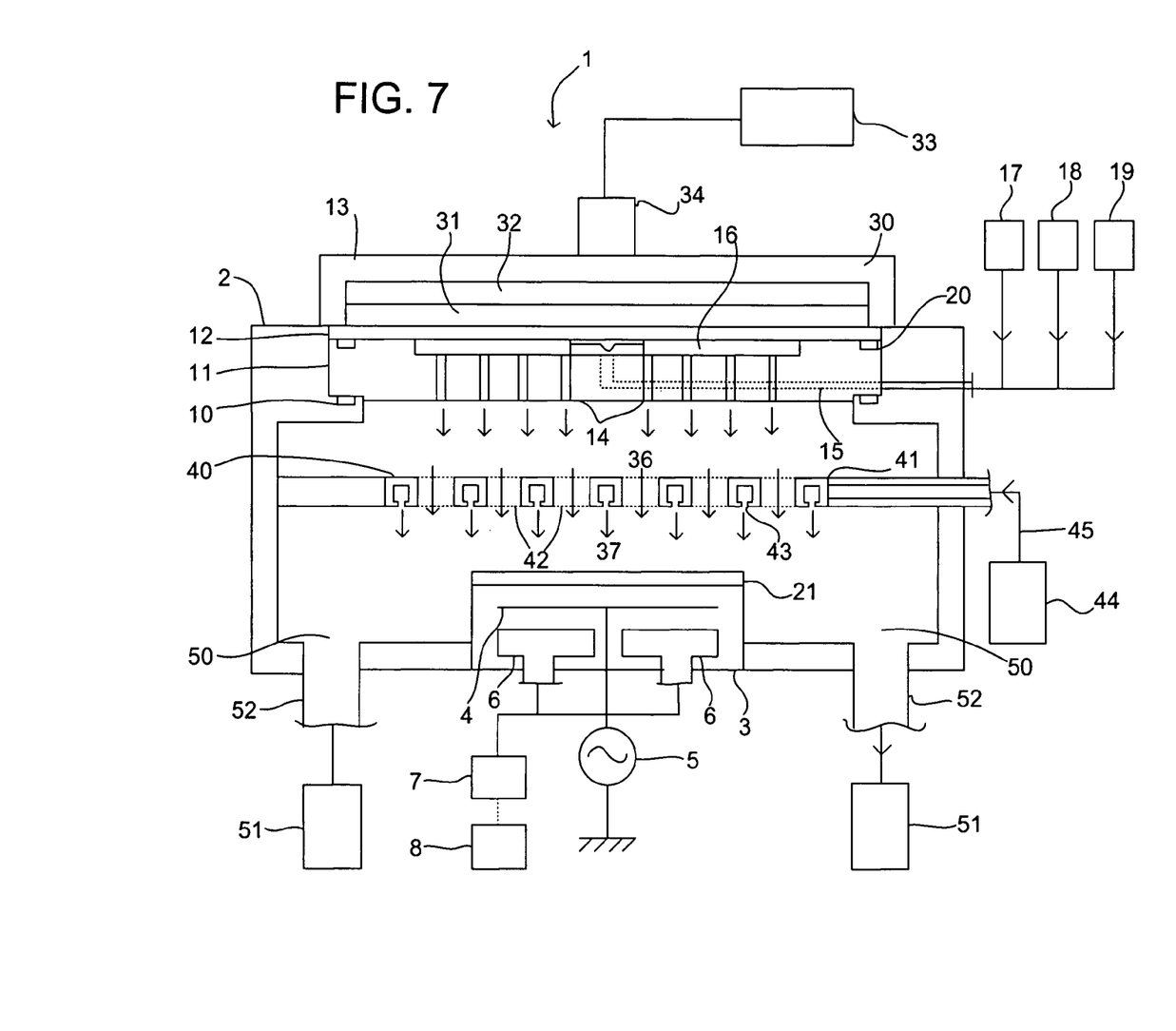
FIG. 7 is a schematic view of a longitudinal section of a plasma film forming device 1 according to the present invention.

FIG. 7 is a schematic view of a vertical section of a plasma film forming device 1 according to the present invention. This plasma film forming device 1 is a CVD (Chemical Vapor Deposition) device, which generates plasma using radial line slot antennas.

The plasma film forming device 1 is provided with, for example, a treatment vessel 2 having a generally cylindrical form with an openable top section. The treatment vessel 2 may be formed, for example, from an aluminum alloy. The treatment vessel 2 is grounded. A placing base 3 for placing, for example, the substrate 21, is provided on the center of the bottom of the treatment vessel 2.

On the placing base 3, for example, an electrode plate 4 is embedded, and the electrode plate 4 is connected, for example, to a high-frequency power source for a bias 5 of 13.56 MHz, which is externally provided to the treatment vessel 2. By this high-frequency power source for bias 5, charged particles in the plasma can be pulled in using the surface of placing base 3 as cathode electrode. The electrode plate 4 is also connected to a direct current power source (not shown), and is capable of electrostatically absorbing the substrate 21 onto the placing base 3 by generating an electrostatic force on the surface of the placing base 3.

Inside the placing base 3 is provided a cooling jacket 6, which is a temperature regulator, for example, that circulates a cooling medium. The cooling jacket 6 is connected to a cooling medium temperature regulator 7 for regulating the temperature of the cooling medium. A temperature control 8 controls the temperature of the cooling medium at the cooling medium temperature regulator 7. Thus, the temperature control 8 sets the cooling medium temperature of the cooling medium temperature regulator 7, and the cooling medium temperature regulator 7 adjusts the temperature flow into the cooling jacket 6, thereby the temperature of the placing base 3 can be controlled. As a result, the substrate 21 placed on the placing base 3 may be maintained at a temperature not more than a predetermined temperature.

On the upper opening of the treatment vessel 2, is provided a shower ring 11 as a plasma gas supply structure, through a sealing material 10, such as an O-ring to secure airtightness. Inside the treatment vessel 2 is closed by this shower ring 11. On the upper side of the shower ring 11, is provided a cover plate 12, and radial line slot antennas 13 are provided on the upper portion of the cover plate 12 as a high-frequency wave supply unit to supply microwaves for plasma generation.

The shower ring 11 is formed, for example, in a disk shape, and arranged so as to face the placing base 3. High dielectric materials, such as aluminum nitride are utilized for the shower ring 11.

Formed on the shower ring 11, are a plurality of feed gas supplying holes 14, which penetrate in vertical directions. Further, on to the shower ring 11, is a gas supplying pipe 15, which horizontally passes through inside the shower ring 11 from the side face of the treatment vessel 2, and communicates with the upper face from the center of the shower ring 11. Formed on the upper face of the shower ring 11, where the gas supplying pipe 15 communicates, is a groove, and a gas passage 16 is formed between the shower ring 11 and the cover plate 12. The gas passage 16 is communicated with the gas supply hole 14. Thus, the plasma gas supplied to the gas supplying pipe 15 is transferred to the gas passage 16 though the gas supplying pipe 15, and supplied to the treatment vessel 2 through each gas supplying hole 14 from the gas passage 16.

The gas supplying pipe 15 communicates with, for example, three gas sources, which are provided externally to the treatment vessel 2, a first gas supply source 17, a second supply source 18, and a third gas supply source 19. The gas may be enclosed within each of first, the second, and the third gas supply sources 17, 18 and 19. Then, the gases may be supplied in the treatment vessel 2. The plasma gas to process the CF film and the plasmanized material gas to form the insulating film may be enclosed in the first, the second, and the third gas supply sources 17, 18, and 19. In the gas supplying sources 17, 18 and 19, for example, CO gas, plasmanized nitrogen gas and plasmanized ammonia gas may be enclosed. Further, in the gas supplying sources 17, 18 and 19, a rare gas, such as argon gas or hydrogen gas may also be enclosed.

The cover plate 12 is adhered to the upper face of the shower ring 11 through a sealing member 20, such as an O-ring. The cover plate 12 is formed by a dielectric body, such as $Al_2O_3$.

The radial line slot antennas 13 are provided with an antenna main body 30 in a virtually cylindrical form with an opening on the lower face. A slot plate 31, which has a plurality of slots formed, in a disk shape is provided on the opening on the lower face of the antenna main body 30. On the upper portion of the slot plate 31 in the antenna main body 30, provided is a retardation plate 32 formed by a low-loss dielectric material. On the upper portion of the antenna main body 30, connected is a coaxial wave guide 34, which leads to a microwave oscillator 33. The microwave oscillator 33 is provided externally to the treatment vessel 2, and is capable of oscillating microwaves of a predetermined frequency, such as 2.45 GHz, against the radial line slot antennas 13. By this configuration, the microwaves oscillating from the microwave oscillator 33 are emitted towards the inside of the treatment vessel 2 though the cover plate 12 and the shower ring 11 after transmission in the radial line slot antennas 13, compressed into a short-wave length by the retardation plate 32, and generate a circular polarized wave by the slot plate 31.

Between the placing base 3 and the shower ring 11 inside the treatment vessel 2, provided is a feed gas supplying structure 40, for example, in a virtually flat plate form. With respect to the feed gas supplying structure 40, the outer shape is formed in a disk shape at least larger than the diameter of the substrate viewed from a plane face, and the structure is arranged so as to face the placing base 3 and the shower ring 11. By this feed gas supplying structure 40, the inside of the treatment vessel 2 is divided into a plasma exciting area 36 on the shower ring 11 side, and a plasma diffusing area 37 on the placing base 3 side.

Figure 8:
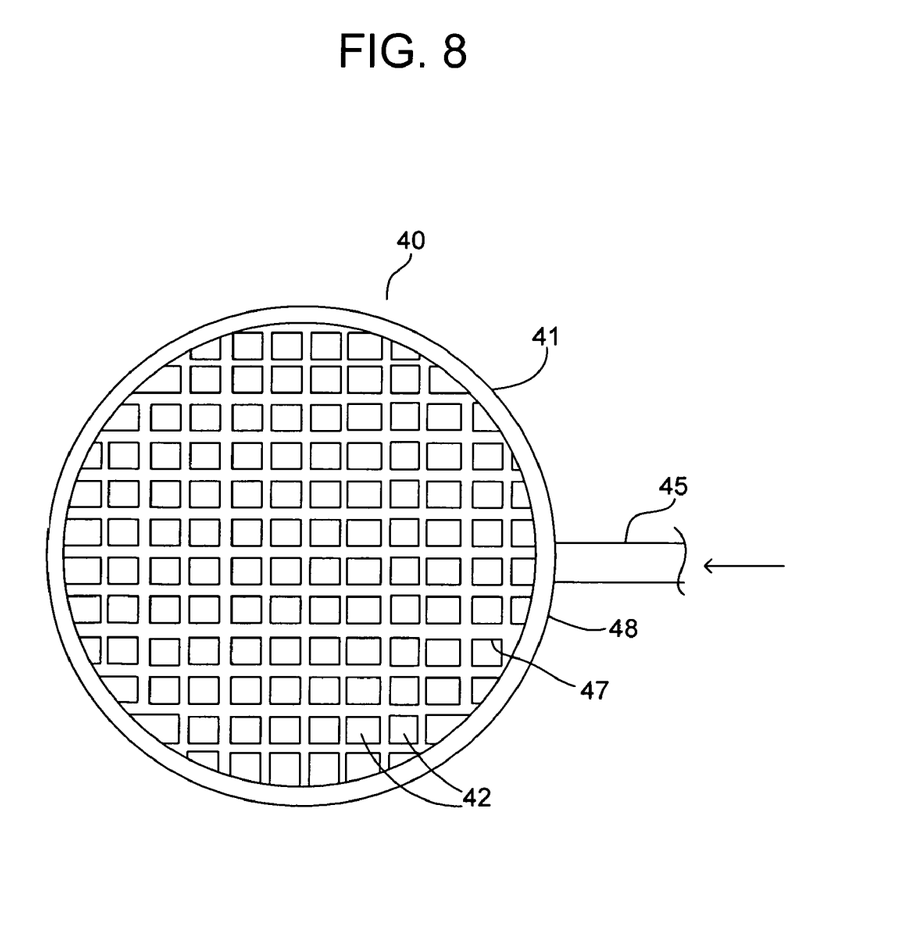
FIG. 8 is a plan view of a feed gas supplying structure.

The feed gas supplying structure 40 is configured by continuous feed gas supplying pipes 41 arranged in a virtual lattice shape on an identical plane as shown in FIG. 8. The feed gas supplying pipes 41 are configured by, for example, a circular pipe 47 which is circularly arranged on the outer circumference of the feed gas supplying structure 40, and a lattice shaped pipe 48, which arranges a plurality of vertical and horizontal pipes so as to orthogonally cross inside the circular pipe 47. With respect to these feed gas supplying pipes 41, the longitudinal section is formed in a rectangular shape viewed from an axial direction, and all of them communicate with each other.

Further, onto the clearance between the feed gas supplying pipes 41 arranged in a lattice shape in the feed gas supplying structure 40, formed is a plurality of openings 42. The plasma generated in the plasma exciting area 36 on the upper side of the feed gas supplying structure 40 passes through these openings 42 and enters into the plasma diffusing area 37 on the placing base 3 side. The plurality of openings 42 are formed such that the transmissivity L of the plasma is not less than 25%, for example, about 30% to 80%. This transmissivity L of the plasma can be indicated by a formula (1):

$$L = \frac{\text{Total opening area of the openings 42}}{\text{Plane area of the feed gas supplying srtucture 40}} e^{\frac{\alpha t}{d}} \quad (1)$$

(α in the formula (1) is a profile coefficient of the openings 42 indicated by a diffusion equation of the plasma, t is a thickness of the feed gas supplying structure 40, and d is a dimension of one opening 42.)

For example, in a case when the plane area of the feed gas supplying structure 40 is 0.07 m², the total opening area of the openings 42 is 0.05 m², and the shape viewed from the plane of the openings 42 is a square where the length d of one end is 25.9 mm, the profile coefficient α is −4.44 by the diffusion equation of the plasma. In case when the thickness t of the feed gas supplying structure 40 is 3.2 mm, the transmissivity L of the plasma is 41% by the formula (1).

The dimension of each opening 42 is, for example, configured to be shorter than the wavelength of the microwaves emitted from the radial line slot antennas 13. In this way, the microwaves supplied from the radial line slot antennas 13 are reflected at the feed gas supplying structure 40, thereby preventing the microwaves from entering into the plasma diffusing area 37. As a result, the damage to the substrate by the microwaves can be prevented without directly exposing the substrate 21 on the placing base 3 to the microwaves. The surface of the feed gas supplying structure 40, that is, the surface of the feed gas supplying pipes 41 is coated, for example, by a non-conducting film, which prevents the feed gas supplying structure 40 from spattering by the charged particle on the plasma, thereby preventing the metal contamination of the substrate by the particle spattered by the spattering.

Figure 9:
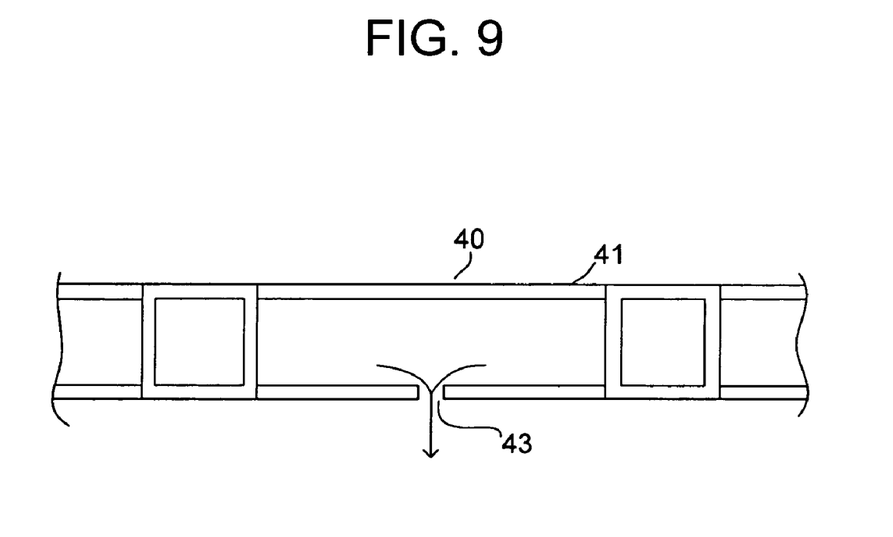
FIG. 9 is a schematic view of a longitudinal section showing a structure of feed gas supplying pipes of a feed gas supplying structure.

On the lower face of the feed gas supplying pipes 41 of the feed gas supplying structure 40, a plurality of feed gas supplying openings 43 are formed as shown in FIGS. 7 and 9. These feed gas supplying openings 43 are equally arranged in the face of the feed gas supplying structure 40. In addition, the feed gas supplying openings 43 may be equally arranged on an area facing the substrate 21 placed on the placing base 3. The feed gas supplying pipes 41 are connected to a gas pipe 45, which is communicated with the feed gas supplying source 44 provided externally to the treatment vessel 2 as shown in FIG. 7. In the feed gas supplying source 44, the feed gas is enclosed. For example, a CF based gas, or an insulating material (mono-methylsilane (1MS), di-methylsilane (2MS), or tri-methylsilane, (3MS)) may be enclosed as a material gas. The material gas supplied to the feed gas supplying pipes 41 from the feed gas supplying source 44 through the gas pipe 45 is discharged towards the plasma diffusing area 37 located on the lower side of each feed gas supplying opening 43.

On the bottom of the treatment vessel 2, provided is an exhaust opening 50 to exhaust an atmosphere inside the treatment vessel 2. The exhaust opening 50 is connected to an exhaust pipe 52, which leads to an exhaust device 51, such as a turbo molecular pump. The inside of the treatment vessel 2 can be decompressed to a predetermined pressure by the exhaust from this exhaust opening 50.

Next, a plasma film forming process performed in the plasma film forming device 1, which is configured as described above, is hereinafter explained. First, the substrate 21 is transferred into the treatment vessel 2, and vacuumed and retained on the placing base 3. At this time, a cooling medium in a low ambient temperature, such as 23 degree/C. is circulating in the cooling cabinet 6 by the setting of the temperature control 8, thereby the placing base 3 is maintained in an ambient temperature. Thus the substrate 21 placed on the placing base 3 is maintained in the ambient temperature. Subsequently, the exhaust from the treatment vessel 2 is begun by the exhaust device 51, and the pressure inside the treatment vessel 2 is reduced to a predetermined pressure, such as 13.3 Pa (100 mTorr).

When the inside of the treatment vessel 2 is decompressed, a plasma gas, such as argon gas and hydrogen gas, ammonia gas, nitrogen gas, or $CO_2$ gas is supplied to the plasma exciting area 36 from the shower head 11. Also, from the radial line slot antennas 13, a microwave of, for example, 2.45 GHz, is emitted to the plasma exciting area 36 located right below. By this emission of microwaves, the plasma gas is plasmanized in the plasma exciting area 36, and for example, the nitrogen gas is ionized or radicalized. At this time, the microwaves progressing downwards reflects at the feed gas supplying structure 40, and stays within the plasma exciting area 36. As a result, high density plasma is generated within the plasma exiting area 36. For example, in a case when processing a CF film formed on the substrate, the reduced gas (such as CO gas), which is generated by such way, is used.

Meanwhile, a cathodic voltage is applied to the placing base 3 by the high-frequency power source for bias 5, and the plasma in the plasma exciting area 36 passes through the openings 42 of the feed gas supplying structure 40 and diffused inside the plasma diffusing area 37 located on the lower side of the feed gas supplying structure 40. The SiC based gas (mono-methylsilane, di-methylsilane, or tri-methylsilane, etc.) which is a material gas, is supplied to the plasma diffusing area 37 from the feed gas supply opening 43 of the feed gas supplying structure 40. The SiC based gas is, for example, radicalized by the plasma supplied from upper side. By this radical, or the radical from the nitrogen gas supplied from the plasma exciting area 36 described above, the insulating film (such as, SiCN film), which consists of the SiC based gas and the nitrogen atom, is formed and grown on the substrate 21.

As the growth of the insulating film progresses and the insulating film of a predetermined thickness is formed on the substrate 21, the emission of the microwave, and the supply of the material gas and plasma gas is stopped. Thereafter, the substrate 21 is transferred from the treatment vessel 2, thereby a series of the plasma film forming process is completed. The substrate 21 completed with the plasma film forming process is patterned by, for example, the photolithography method, and a gate insulating film of a predetermined shape is formed from the insulating film. Further, an electrode film is laminated by the photolithography method, thereby, for example, a capacitor of a MIS (Metal Insulator Semiconductor) structure is formed.

Figure 10:
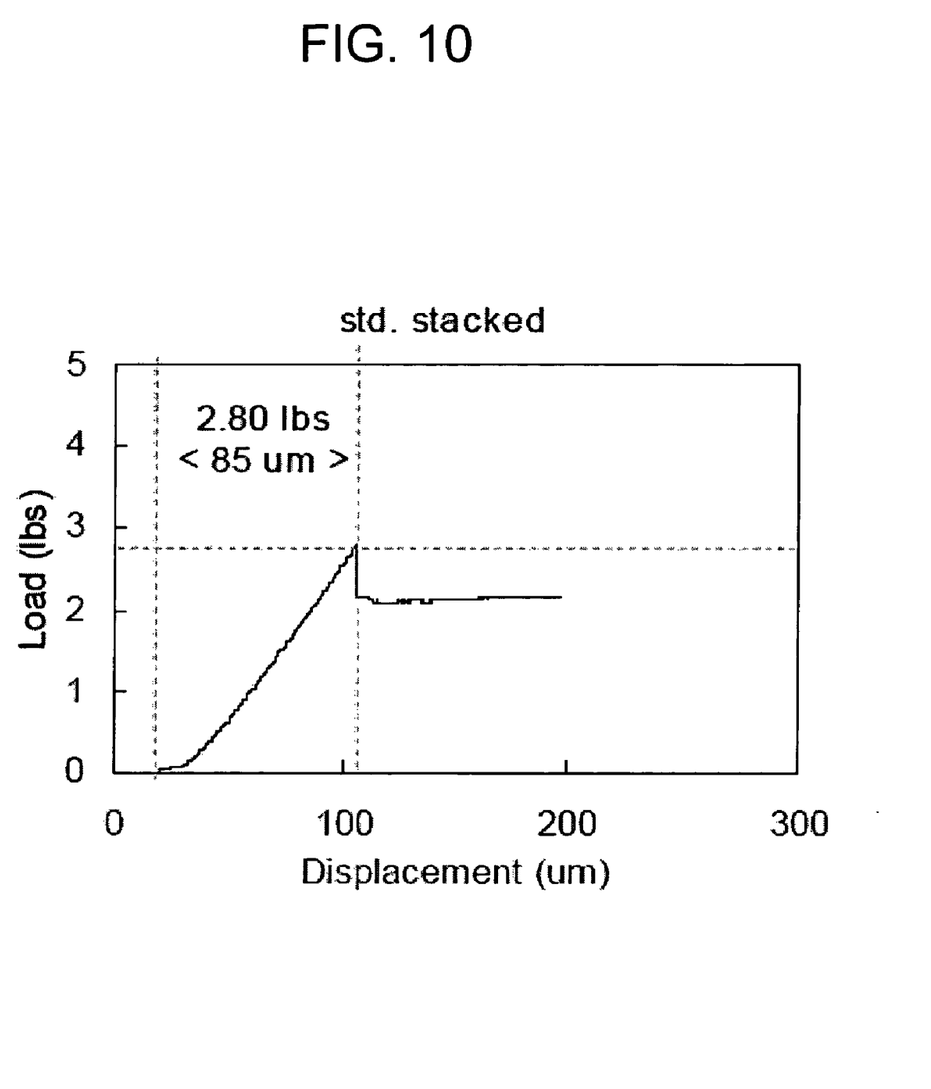
FIG. 10 illustrates a measurement of contactablity of a CF film and an insulating film of an electronic component manufactured without CO plasma process on the CF film.

Next explained is the contactability of a CF film and an insulating film for an electronic component according to the present invention referring to experimental data. FIG. 10 shows the measurement of the contactability of the CF film and the insulating film by using a 4-Point Bending Method. In the 4-Point Bending Method, first, form a thin film on a substrate, thereafter, cut it into a strip as a sample, and place the sample horizontally. The method then applies a load in a perpendicular direction on both ends of the long side of the horizontally placed sample, and a measurement of the position where the film is peeled off, and the load when the film is peeled off is obtained.

FIG. 10 illustrates a measurement of the contactability of a CF film and an insulating film by applying the 4-Point Bending Method to the electronic component manufactured without the CO plasma process on the CF film. The horizontal axis in the FIG. 10 indicates the amount of stroke when applying a load on a sample. The vertical axis in FIG. 10 indicates the size of the load applied to the sample.

It can be seen from FIG. 10 that the amount of stroke increases as the load applied to the sample increases. That is, it can be seen that the load against the sample film is increasing. And, the amount of stroke sharply decreases as the load reaches at 2.80 lbs. This indicates a condition that the film is peeled off in a horizontal direction from the sample face because the sample film can not withstand the load, thereby the load is relived.

Figure 11:
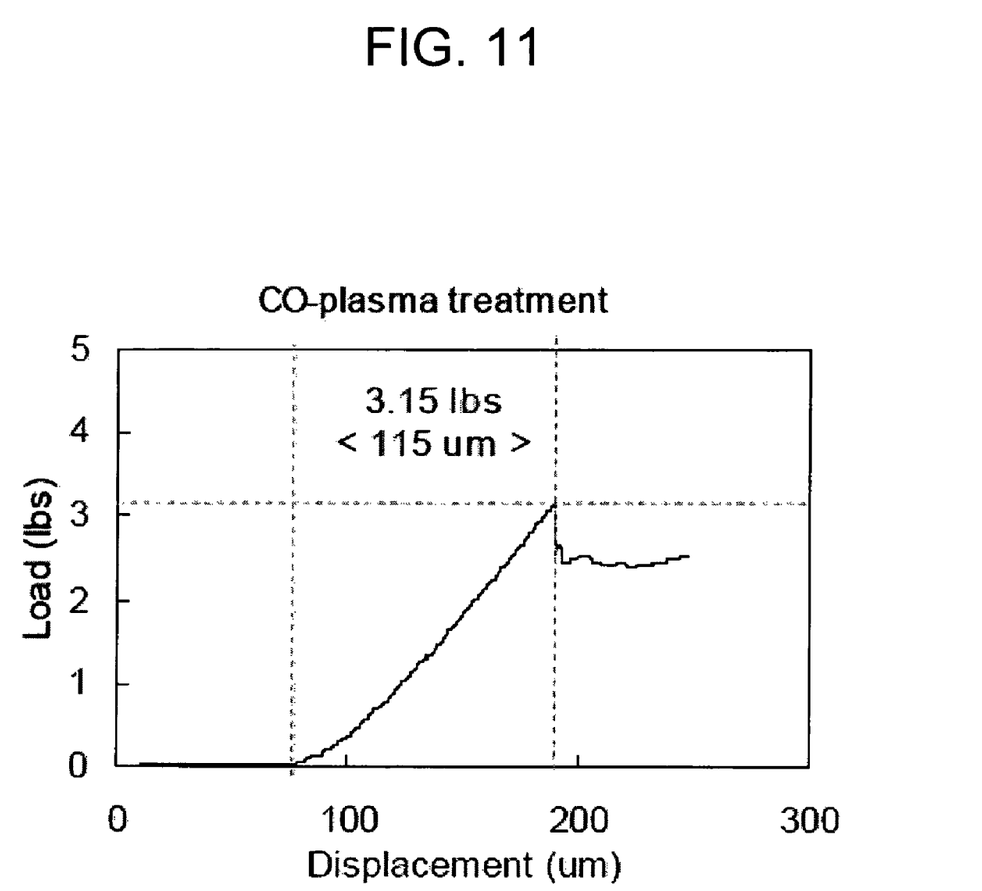
FIG. 11 illustrates a measurement of contactablity of a CF film and an insulating film of an electronic component manufactured with a CO plasma process on the CF film.

FIG. 11 illustrates a measurement of the contactability of a CF film and an insulating film by applying the 4-Point Bending Method to an electronic component manufactured by applying the CO plasma process to the CF film. The horizontal axis in FIG. 11 indicates the amount of stroke when applying a load on a sample. The vertical axis in FIG. 11 indicates the size of the load applied to the sample.

It can be seen from FIG. 11 that the amount of stroke increases as the load applied to the sample increases. That is, it can be seen that the load against the sample film is increasing. And, the amount of stroke sharply decreases as the load reaches 3.15 lbs. This indicates the condition that the film is peeled off in a horizontal direction from the sample face because the sample film can not withstand the load, thereby the load is relived.

By comparing the experimental results of FIGS. 10 and 11, it can be seen that the electronic component, which has the insulating film formed after applying the CO plasma process on the CF film, has a higher contactablity of the CF film and the insulating film than the electronic component without the CO plasma process.

One embodiment of the present invention is explained above, however, the present invention is not limited to the above specific examples. For example, the insulating film is formed on the substrate in the embodiment described above, however, the plasma processing method for forming a film according to the present invention may be applied for forming other films, such as an electrode film. Also, other gases, such as xenon gas, or krypton gas, may be utilized as the plasma gas supplied from the shower ring 11. Further, the plasma processing method for forming a film according to the present invention can be applied not only to the substrate of the semiconductor device, but also, for example, to the substrates for manufacturing liquid crystal display devices or organic EL elements.

What is claimed is:

1. A plasma processing method for forming a film on a substrate, the method comprising the steps of:
    forming a CF film containing carbon and fluorine on the substrate by using a $C_aF_b$ gas, with "b" satisfying an equation "b=2×a−2" wherein "a" is a number greater than 1;
    exposing the CF film to a plasma to reduce fluorine existing on a surface of the CF film; and
    forming an insulating film directly on the CF film by using an insulating material gas processed with a plasma, wherein the step of forming the insulating film includes the step of forming a $Si_xC_xN_z$ film on the CF film, where "y" and "z" satisfy an equation "y<z", and the step of forming a $Si_xC_yN_z$, film on the $Si_xC_yN_z$ film, where "y'" and "z'" satisfy an equation "y'>z'".

2. The plasma processing method of claim 1, wherein the insulating material gas is methylsilazane.

3. The plasma processing method of claim 1, wherein the insulating material gas is selected from a group consisting of: a mono-methylsilane, a di-methylsilane or a tri-methylsilane.

4. The plasma processing method of claim 1, wherein the $C_aF_b$ gas is selected from a group consisting of: a $C_4F_6$ gas, a $C_5F_8$ gas or a $C_3F_4$ gas.

5. The plasma processing method of claim 1, wherein the plasma to which the CF film is exposed is a CO plasma, an HCO plasma or a $CH_3CO$ plasma.

6. An electronic component having a film on a substrate, the electronic component manufactured by a method comprising the steps of:
    forming a CF film containing carbon and fluorine on the substrate by using a $C_aF_b$ gas, with "b" satisfying an equation "b=2×a−2" wherein "a" is a number greater than 1;
    after forming the CF film, exposing the CF film to a CO plasma to reduce fluorine existing on a surface of the CF film; and
    forming an insulating film directly on the CF film by using an insulating material gas processed with a plasma.

7. The electronic component of claim 6, wherein the insulating film is a $Si_xC_yN_z$ film.

8. The electronic component of claim 6, wherein the step of forming the insulating film comprises the step of forming at least two insulating films on the CF film.

9. The electronic component of claim 6, wherein the step of forming the insulating film includes the step of forming a $Si_xC_yN_z$ film on the CF film, with "y" and "z" satisfy an equation "y<z".

10. The electronic component of claim 9, wherein the step of forming the insulating film includes the step of forming a $Si_xC_yN_z$, film on the $Si_xC_yN_z$ film, where "y'" and "z'" satisfy an equation "y'>z'".

11. A method for forming a film on a substrate, the method comprising the steps of:
    forming a CF film containing carbon and fluorine on the substrate by using a $C_aF_b$ gas, with "b" satisfying an equation "b=2×a−2" wherein "a" is a number greater than 1;
    after forming the CF film, exposing the CF film to a CO reducing gas to reduce fluorine existing on a surface of the CF film; and
    forming an insulating film directly on the CF film by using an insulating material gas.

12. The method of claim 11, wherein the insulating film is a $Si_xC_yN_z$ film.

13. The method of claim 11, wherein the step of forming the insulating film includes the step of forming a $Si_xC_yN_z$ film on the CF film, where "y" and "z" satisfy an equation "y<z".

14. The method of claim 13, wherein the step of forming the insulating film includes the step of forming a $Si_xC_yN_z$, film on the $Si_xC_yN_z$ film, where "y'" and "z'" satisfy an equation "y'>z'".

15. The method of claim 11, wherein the insulating film is a $Si_xC_y$ film.

16. The method of claim 11, wherein the step of forming the insulating film comprises the step of forming at least two insulating films on the CF film.

17. The method of claim 11, wherein the CO reducing gas includes a CO plasma.

18. The method of claim 11, wherein the $C_aF_b$ gas is selected from a group consisting of: a $C_4F_6$ gas, a $C_5F_8$ gas or a $C_3F_4$ gas.

19. The method of claim 11, wherein the insulating material gas is selected from a group consisting of: a mono-methylsilane, a di-methylsilane or a tri-methylsilane.

* * * * *